(12) United States Patent
Yu et al.

(10) Patent No.: US 10,490,719 B2
(45) Date of Patent: Nov. 26, 2019

(54) DIE BOND PAD DESIGN TO ENABLE DIFFERENT ELECTRICAL CONFIGURATIONS

(71) Applicant: Lumileds Holding B.V., Schiphol (NL)

(72) Inventors: Wen Yu, Pleasanton, CA (US); Oleg B. Shchekin, San Francisco, CA (US); Franklin Wall, Vacaville, CA (US); Kuochou Tai, Fremont, CA (US); Mohiuddin Mala, San Jose, CA (US); Robert Zona, San Jose, CA (US); Jeffrey Kmetec, Palo Alto, CA (US); Alexander Nickel, Santa Clara, CA (US)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 15/777,295

(22) PCT Filed: Oct. 19, 2016

(86) PCT No.: PCT/US2016/057655
§ 371 (c)(1),
(2) Date: May 18, 2018

(87) PCT Pub. No.: WO2017/087116
PCT Pub. Date: May 26, 2017

(65) Prior Publication Data
US 2018/0337315 A1 Nov. 22, 2018

Related U.S. Application Data

(60) Provisional application No. 62/258,385, filed on Nov. 20, 2015.

(30) Foreign Application Priority Data

Mar. 9, 2016 (EP) .................................... 16159400

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/05* (2013.01); *H01L 24/06* (2013.01);
(Continued)

(58) Field of Classification Search
None
See application file for complete search history.

(56) References Cited

U.S. PATENT DOCUMENTS 9,379,161 B2 * 6/2016 Schlereth ............... H01L 27/156
9,412,724 B2 * 8/2016 Weng ................... H01L 25/0753
(Continued)

FOREIGN PATENT DOCUMENTS

WO 2014/141009 9/2014
WO 2015/052616 4/2015

*Primary Examiner* — Minh Loan Tran
(74) *Attorney, Agent, or Firm* — Volpe and Koenig, P.C.

(57) ABSTRACT

Light emitting die (300) comprising a plurality of light emitting elements (310A, 310B), each having a pair of bond pads (N1,P1 and N2,P2), wherein at least two diagonally opposite bond pads of adjacent light emitting elements on a die have their facing corners truncated (330) to enable a direct diagonal coupling of a complementary pair of diagonally opposite bond pads when the die is monted on a substrate on which an interconnection pattern is formed. By enabling diagonal as well as lateral coupling of the bond pads of multiple light emitting elements of a die, the multiple light emitting elements may be arranged in a variety of series and/or parallel configurations, thereby facilitating the use of the same die at different nominal operating voltages with a single interconnect layer on the substrate upon which the die is mounted.

16 Claims, 6 Drawing Sheets

(51) Int. Cl.
*H01L 23/00* (2006.01)
*H01L 27/15* (2006.01)
*H01L 33/38* (2010.01)
*H01L 25/075* (2006.01)

(52) U.S. Cl.
CPC ........ *H01L 25/0753* (2013.01); *H01L 27/153* (2013.01); *H01L 33/38* (2013.01); *H01L 2224/05013* (2013.01); *H01L 2924/12041* (2013.01)

(56) References Cited

U.S. PATENT DOCUMENTS

| | | | |
|---|---|---|---|
| 9,478,712 B2 * | 10/2016 | Choy | H01L 27/156 |
| 2013/0126914 A1 | 5/2013 | Pan et al. | |
| 2015/0372054 A1 | 12/2015 | Schlereth et al. | |

* cited by examiner

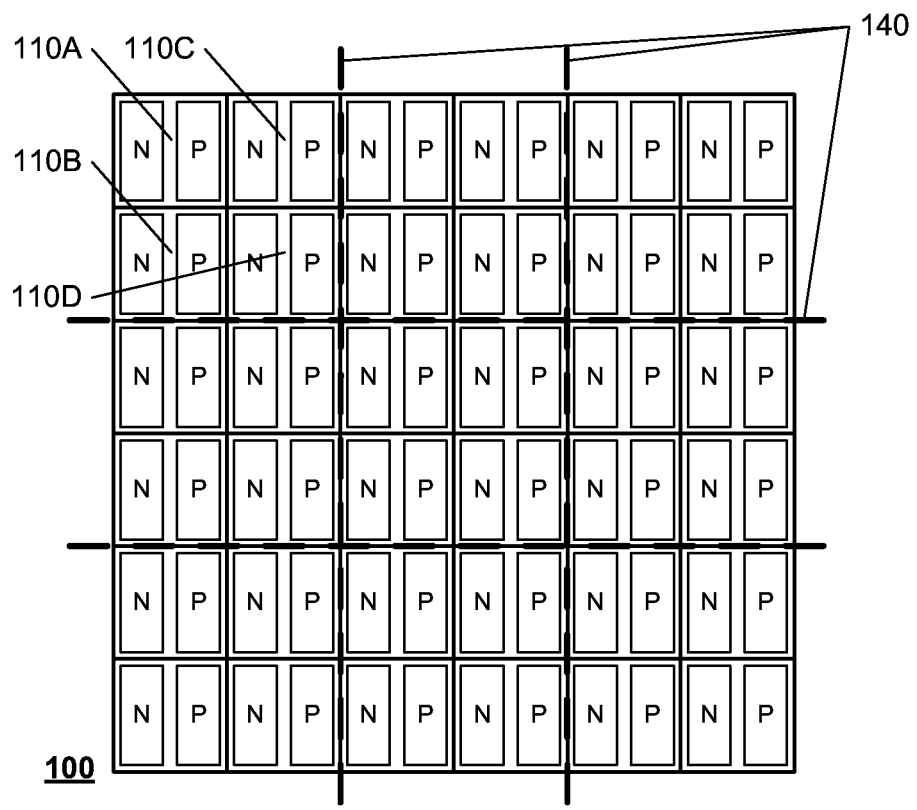
FIG. 1C
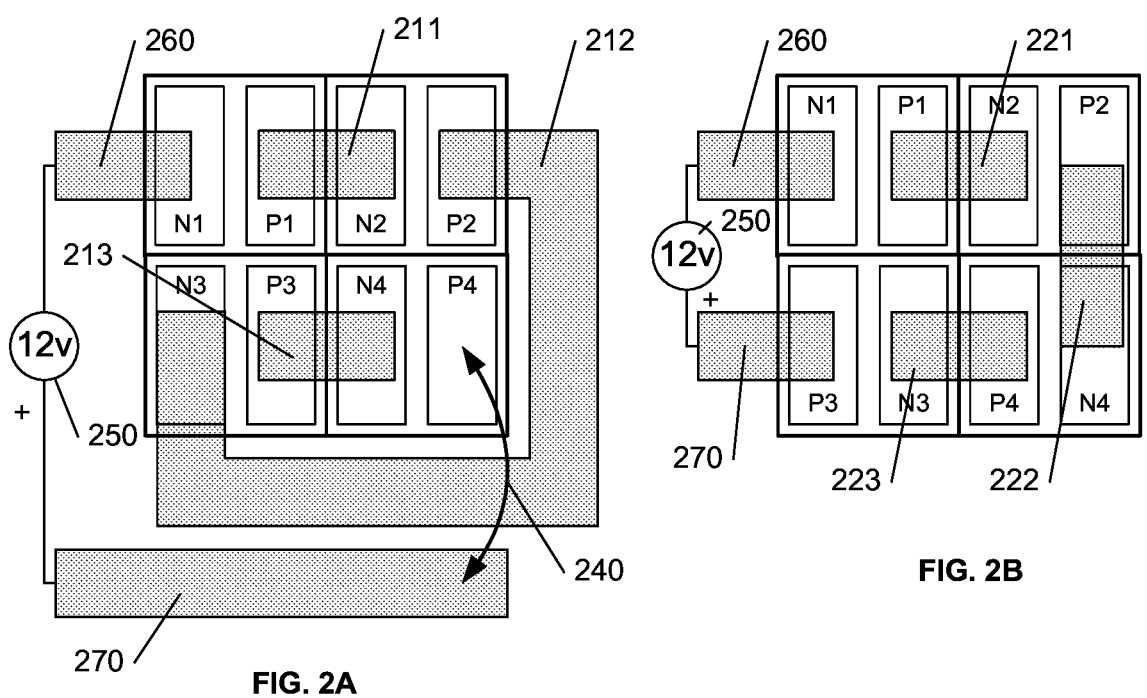
FIG. 2A
FIG. 2B

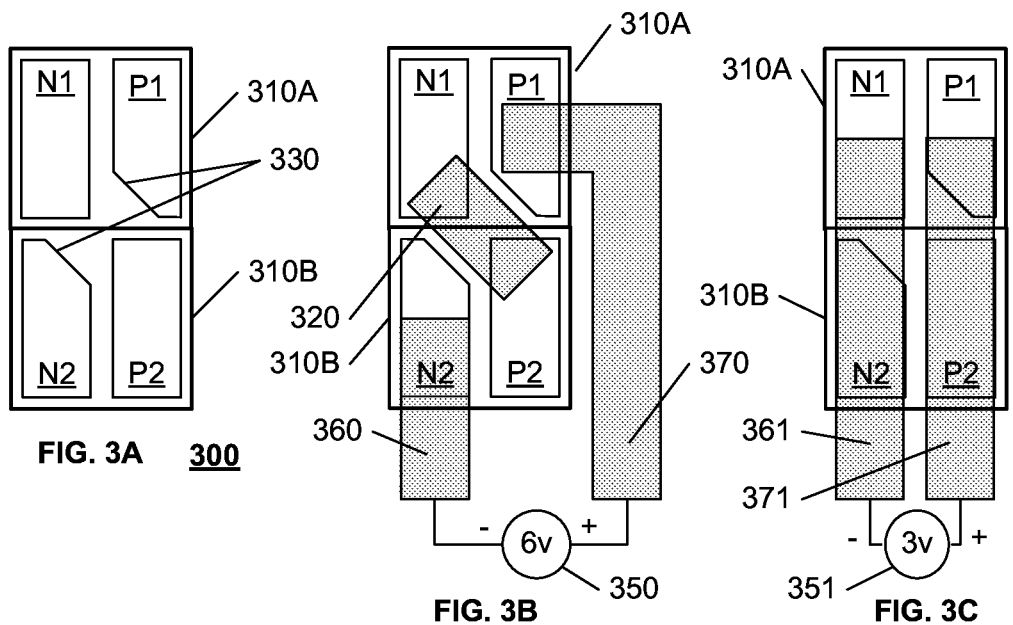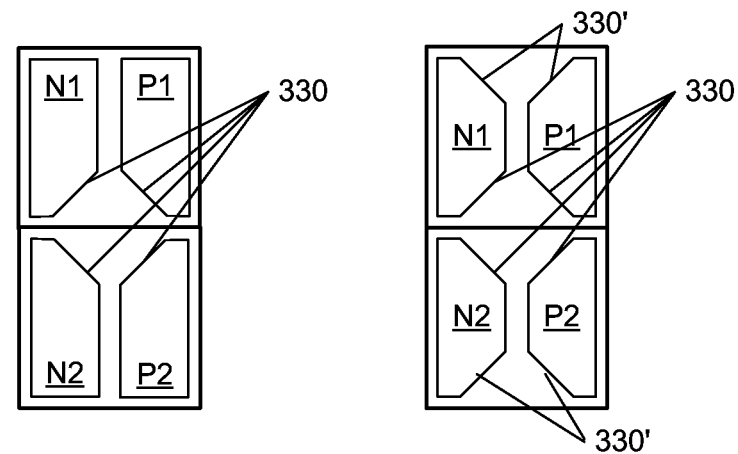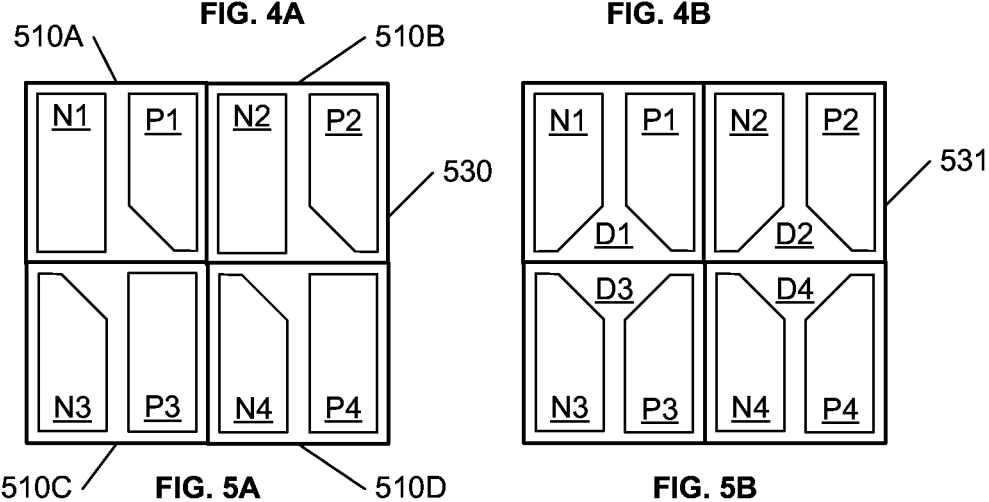

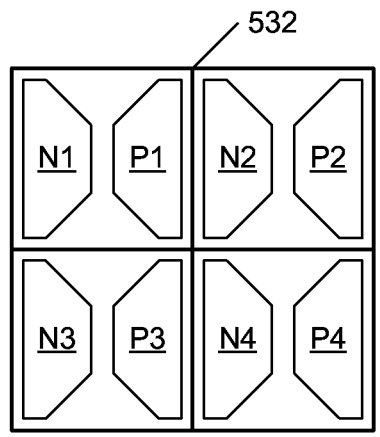
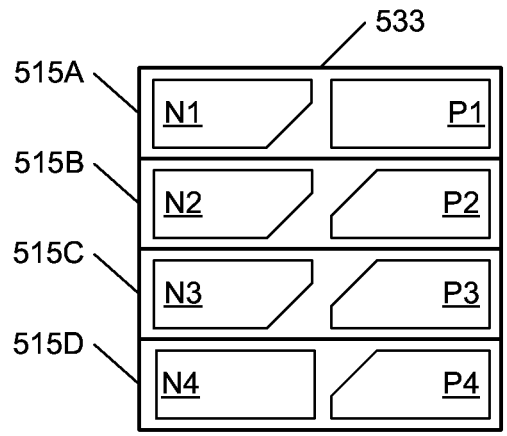
FIG. 5C  FIG. 5D
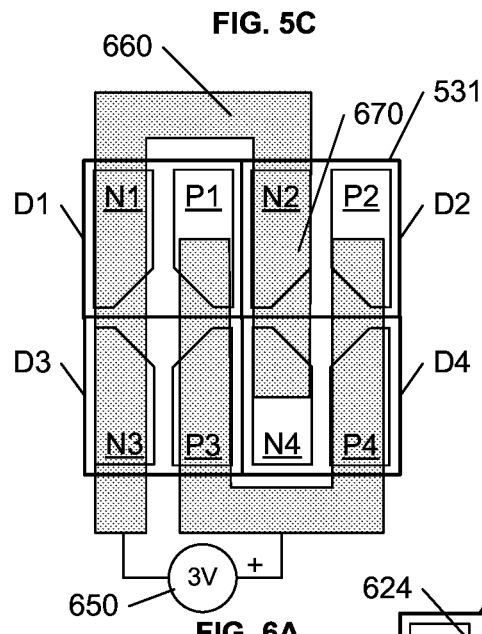
FIG. 6A
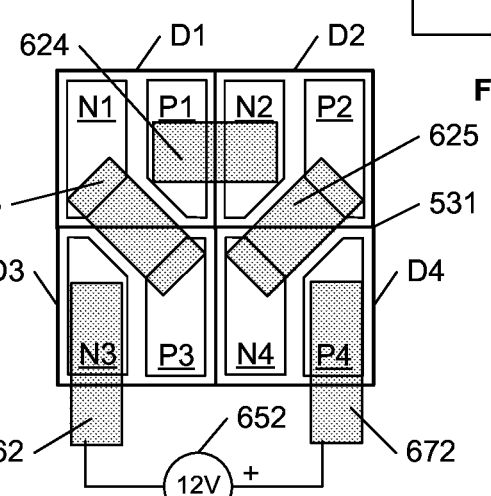
FIG. 6B
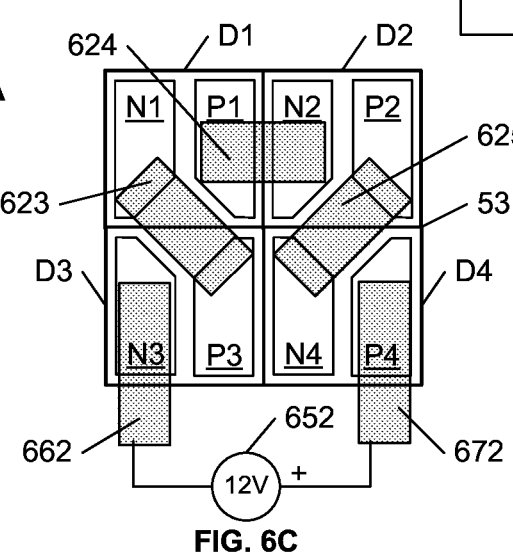
FIG. 6C

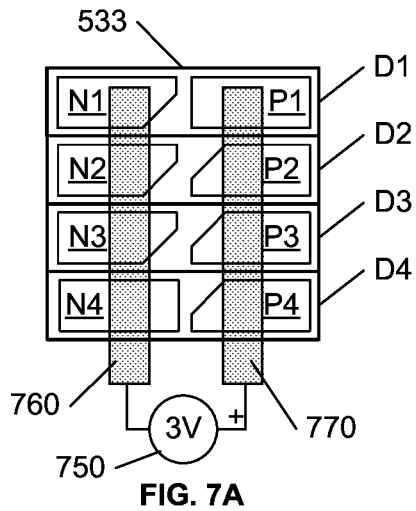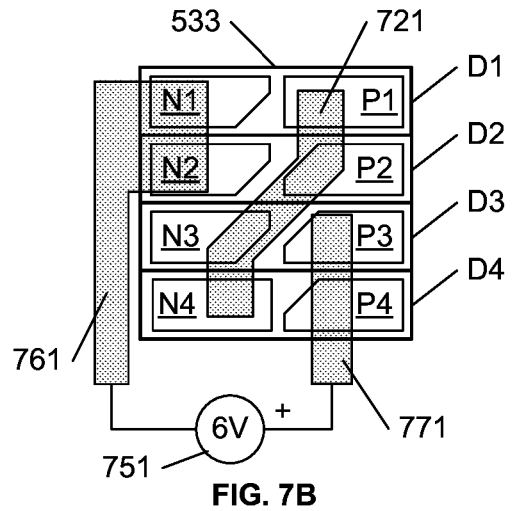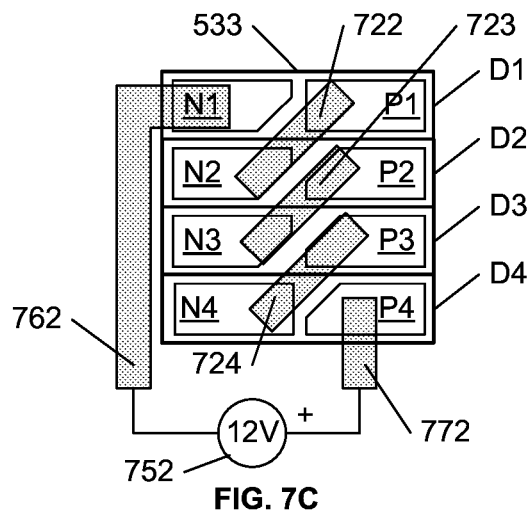

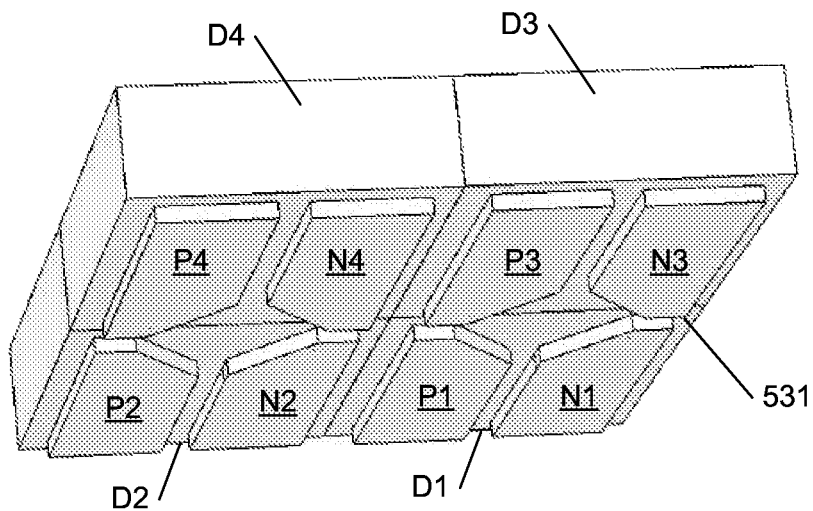
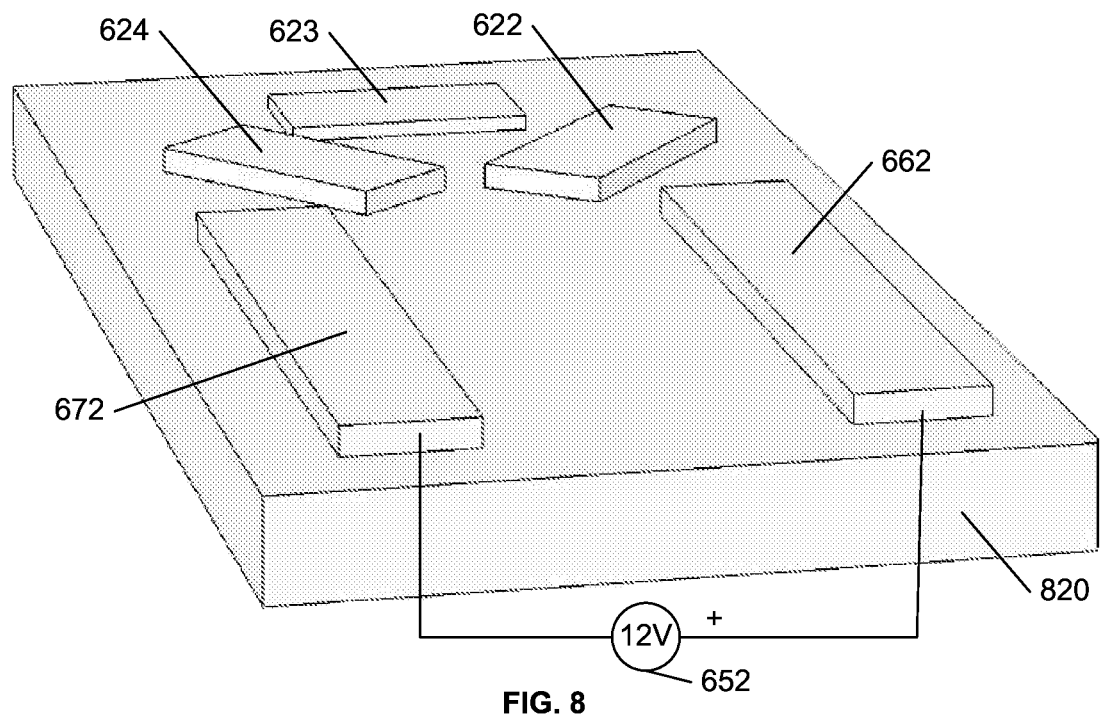
FIG. 8

DIE BOND PAD DESIGN TO ENABLE DIFFERENT ELECTRICAL CONFIGURATIONS

CROSS-REFERENCE TO RELATED APPLICATIONS

The present application claims priority to U.S. Provisional Patent Application No. 62/258,385, filed Nov. 20, 2015 and European Patent Application No. 16159400.7 filed Mar. 9, 2016. U.S. Provisional Patent Application No. 62/258,385 and European Patent Application No. 16159400.7 are incorporated herein.

FIELD OF THE INVENTION

This invention relates to the field of light emitting devices, and in particular to a bond pad arrangement for a plurality of light emitting elements that facilitates different electrical configurations of the light emitting elements

BACKGROUND OF THE INVENTION

The demand for high illumination light emitting devices continues to increase, often requiring multiple light emitting elements to be packaged as a single light emitting device. Chip Scale Package light emitting devices (CSP-LEDs) are well suited for such applications because the wafer upon which individual devices are grown can be sliced to include any number of devices, arranged in arrays of different sizes and shapes.

FIG. 1A illustrates an example segment of a wafer 100 that includes a plurality of CSP-LEDs 110, each CSP-LED 110 having a pair of bond pads 120N and 120P for coupling to the n-type and p-type layers of the light emitting element that sandwich a light emitting layer (not illustrated).

FIG. 1B illustrates example slice configurations (dashed bold lines) 130 to produce pairs of CSP-LEDs a first pair containing CSP-LEDS 110A and 110B, and a second pair containing CSP-LEDs 110C and 110D, as well as many other pairs. FIG. 1C illustrates example slice configurations 140 to produce a 2×2 array of CSP-LEDs 110A-110D.

The particular connections of multiple CSP-LEDs to a power source determines the nominal operating voltage of the multiple CSP-LED die. If two CSP-LEDs are arranged in series, the nominal operating voltage of the die is twice the nominal operating voltage of a single CSP-LED; if they are arranged in parallel, the nominal operating voltage of the die is equal to the nominal operating voltage of a single CSP-LED.

If it is known a priori how the multiple CSP-LEDs are to be coupled together, one or more interconnection layers (not illustrated) may be added at the wafer level to enable external coupling to only two contacts on the sliced segment. For example, if the multiple CSP-LEDs are to be configured in parallel, the interconnect layer(s) may couple all of the n-type regions together to form a single N-contact, and all of the p-type regions together to form a single P-contact. In like manner, if the multiple CSP-LEDs are to be coupled in series, the interconnect layer(s) may couple all but one of the n-type regions to a p-type region of an adjacent CSP-LED, the uncoupled n-type region forming the N-contact to the series arrangement, and the remaining uncoupled p-type region forming the P-contact to the series arrangement.

Alternatively, if it is not known how the multiple CSP-LEDs may be coupled, the wafer is sliced with each bond pad isolated from each other bond pad, and the desired interconnection among the CSP-LEDs is provided on the substrate to which the sliced die is mounted. Often, however, achieving the desired interconnection may require the use of a substrate with multiple interconnect layers.

FIG. 2A illustrates a need to use multiple interconnect layers to couple the example 2×2 array of CSP-LEDs in series. For convenience, the pairs of bond pads are labeled N1-P1, N2-P2, N3-P3, and N4-P4. The illustrated conductive segments 211-213 and 260, 270 would be on a substrate (not illustrated), and would provide the illustrated interconnections when the die is mounted on the substrate. The conductive segments 211, 212, and 213 couple P1 to N2, P2 to N3, and P3 to N4, respectively. Pads N1 is the N-contact to the series arrangement, and P4 is the P-contact.

To operate this series arrangement, an external source 250 must be coupled to the N1 and P4 pads using example interconnects 260, 270. Typically, conductive 270 connects pad P4 to the positive side external source 250. However, as can be seen, access to pad P4 is blocked by conductive segment 212, and will require a conductive segment 240 that crosses over the segment 212 without contact. 'Through holes' to the underside of the substrate, or 'vias' to internal layers of the substrate, are typically required to provide the required connection of the P4 pad to conductive segment 270 on another layer. In the alternative the interconnection 212 may be moved to this other layer.

Had it been known a priori that the multiple CSP-LEDs were intended to be arranged in series, the orientation of the bond pads N3-P3 and N4-P4 could have been reversed on the wafer, as illustrated in FIG. 2B. In this example, pads N1 and P3 form the N and P contacts, which can be coupled via conductive segments 260, 270 to an external source 250 using the same layer as the conductive segments 221, 222, and 223. However, with the arrangement of bond pads in FIG. 2B, coupling the multiple CSP-LEDs in parallel will require the use of multiple conductive layers on the substrate.

The customization of the arrangement of pads on a die to satisfy the requirements of particular applications, such as illustrated in FIG. 2B, however, requires individual design and fabrication for each of these applications. If the quantity of dies needed for an application does not warrant such a customization, a multi-layer substrate may be required. Even if the application's quantity of dies warrants such a customization, a more efficient economy of scale could be achieved if the different applications could all use a common die pad arrangement.

SUMMARY OF THE INVENTION

It would be advantageous to provide a bond pad arrangement on a wafer that facilitates coupling to form a variety of arrangements of multiple light emitting devices on the wafer. It would be of further advantage to provide a bond pad arrangement on a wafer that enables the coupling to the variety of arrangements of multiple light emitting devices using a single interconnect layer. It would be of further advantage to provide a bond pad arrangement on the wafer that facilitates slicing the wafer in any desired size while still enabling the coupling to the sliced die using a single interconnect layer.

To better address one or more of these concerns, in an embodiment of this invention, at least two diagonally opposite bond pads of a plurality of light emitting elements on a die are truncated to enable a direct diagonal coupling of a complementary pair of diagonally opposite bond pads when the die is situated on a substrate. By enabling diagonal as well as lateral coupling of the bond pads of multiple light emitting elements of a die, the multiple light emitting elements may be arranged in a variety of series and/or parallel configurations, thereby facilitating the use of the same die at different nominal operating voltages with a single interconnect layer on the substrate upon which the die is mounted.

In an embodiment using two light emitting elements each having a nominal operating voltage of 3 volts, the light emitting elements may be configured to operate at a nominal operating voltage of 3 or 6 volts. In an embodiment using four of these light emitting elements, the light emitting elements may be configured to operate at a nominal operating voltage of 3, 6, or 12 volts, and so on.

In some embodiments, the multiple light emitting elements on the die may be arranged in a linear manner, and in other embodiments, the multiple light emitting elements on the die may be arranged in a two dimensional array.

The truncated bond pads may typically have more than four sides.

BRIEF DESCRIPTION OF THE DRAWINGS

The invention is explained in further detail, and by way of example, with reference to the accompanying drawings wherein:

FIGS. 1A-1C illustrate an example prior art wafer and different slicing patterns to form singulated dies of multiple light emitting devices.

FIGS. 2A, 2B illustrate example interconnect patterns for coupling the multiple light emitting devices on a prior art die.

FIGS. 3A-3C illustrate an example arrangement of truncated bond pads that facilitates alternative couplings of multiple light emitting devices using a single interconnect layer.

FIGS. 4A-4B illustrate example alternative arrangements of truncated bond pads that facilitate alternative couplings of a pair of light emitting devices using a single interconnect layer.

FIGS. 5A-5D illustrate example alternative arrangements of truncated bond pads that facilitate alternative couplings of four light emitting devices using a single interconnect layer.

FIGS. 6A-6C illustrate example single-layer interconnect patterns for coupling four light emitting devices for operation at different nominal voltages.

FIGS. 7A-7C illustrate other example single-layer interconnect patterns for coupling four light emitting devices for operation at different nominal voltages.

FIG. 8 illustrates a die having multiple light emitting devices and an example interconnect pattern on a substrate.

Throughout the drawings, the same reference numerals indicate similar or corresponding features or functions. The drawings are included for illustrative purposes and are not intended to limit the scope of the invention.

DETAILED DESCRIPTION

Figure 1A:
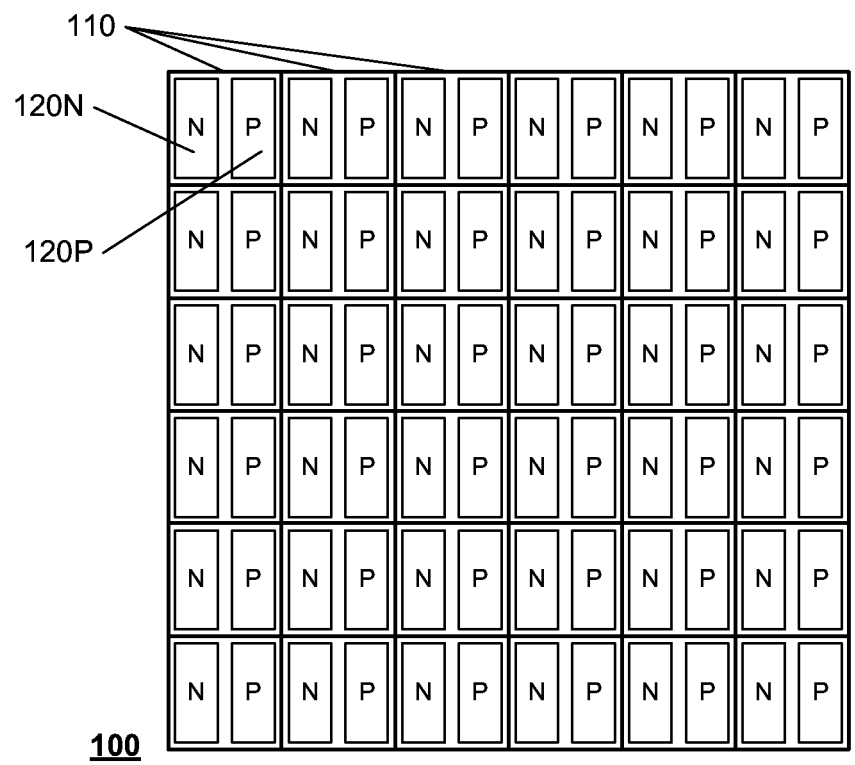
Figure 1B:
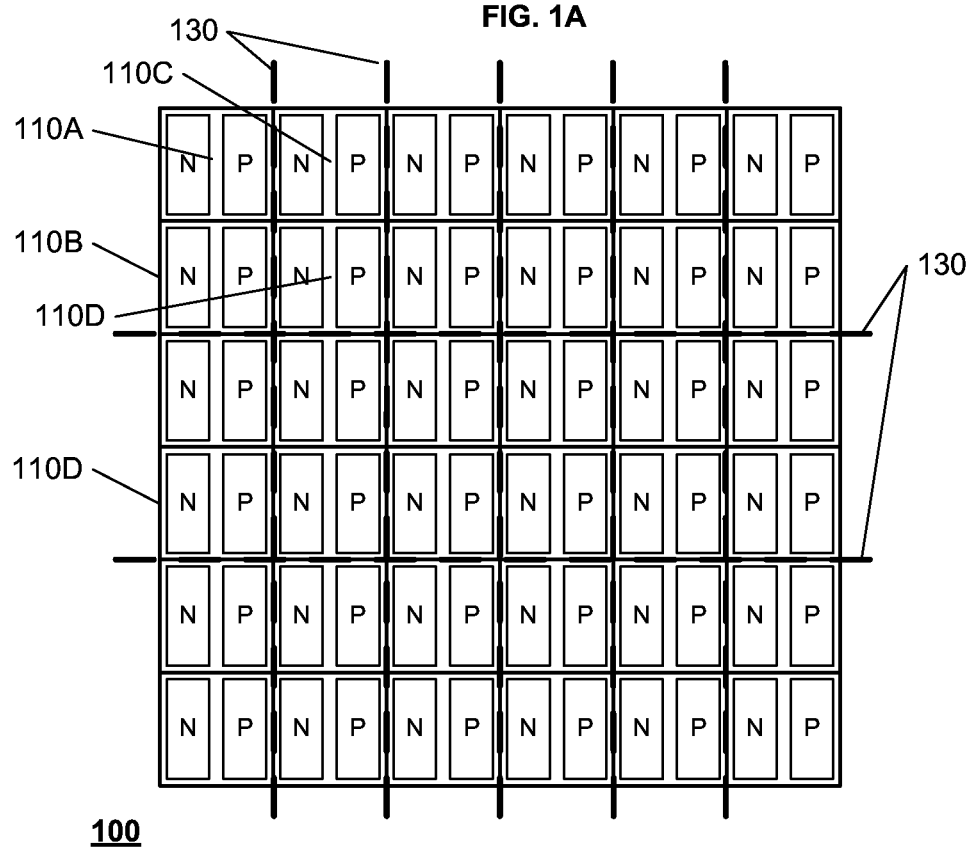

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Conventionally, bond pads on light emitting device dies are rectangular, although a corner of one of the bond pads may be truncated to indicate polarity. The bond pads are generally situated with a separation distance that accommodates manufacturing tolerances with respect to the interconnect patterns on the substrate to which the die is mounted. The rectangular area provides a maximal 'target area' for coupling the connections to the bond pads.

On a die having multiple light emitting devices, each having a pair of bond pads, lateral connections between adjacent bond pads can be easily accommodated, but as illustrated in FIG. 2A, a connection 212 between non-adjacent bond pads P2 and N3 requires that the connection 212 extend beyond the footprint of the die, often causing an isolation of other bond pads (P4) and requiring the use of a multi-layer substrate, as detailed above.

FIGS. 3A-3C illustrate an example arrangement of truncated bond pads N2, P1 on a die 300 with two light emitting devices 310A, 310B. These truncated bond pads N2, P1 facilitates alternative couplings of multiple light emitting devices using a single interconnect layer by enabling a direct diagonal coupling of a complementary pair of diagonally opposite bond pads when the die is situated on a substrate.

The truncated bond pads N2, P1 correspond to conventional rectangular bond pads but are absent a corner portion, providing a non-orthogonal edge 330. These non-orthogonal edges 330 provide a space between them that facilitates a diagonal connection 320 between pads N1 and P2, as illustrated in FIG. 3B. As in the example of FIGS. 2A-2B, the illustrated interconnections 360, 370, 320 would be situated on a substrate (not illustrated), and would provide the coupling among the bond pads when the die 300 is mounted on the substrate. FIG. 8, detailed below, illustrates an example die and substrate combination using interconnections 622, 623, 624, 662, 672 on a substrate 820 to form a series connection of a 2×2 array of light emitting devices of a die 531.

The indicated interconnect pattern of FIG. 3B provides a series connection of light emitting devices 310A, 310B. Current flows from the external source 350 to the P1 bond pad of device 310A via segment 370, through the device 310A to bond pad N1, which is coupled to bond pad P2 of device 310B. The current flows through the device 310B to bond pad N2, which is coupled to the external source 350 via conductive segment 360.

FIG. 3C illustrates an interconnect pattern that provides a parallel connection of the light emitting devices 310A, 310B of the same die 300. Conductive segment 371 is coupled to both N1 of device 310A and N2 of device 310B, and segment 361 is coupled to both P1 of device 310A and P2 of device 310B, coupling devices 310A, 310B in parallel.

In this example, and others herein, the nominal operating voltage of each light emitting device is assumed to be 3 volts although other voltages are known and included within the scope of the invention. Accordingly, the series connection of FIG. 3B will have a nominal operating voltage of 6 volts, while the parallel connection of FIG. 3C will have a nominal operating voltage of 3 volts. Thus, as indicated, the same die 300 may be configured for either 3 volt or 6 volt applications, using interconnections on a single layer. One of skill in the art will recognize that the conventional bond pad arrangement using rectangular bond pads, such as illustrated in FIG. 2B, cannot be configured for a series arrangement without the use of two layers of interconnections.

FIGS. 4A-4B illustrate example alternative arrangements of truncated bond pads that facilitate alternative couplings of a pair of light emitting devices using a single interconnect layer. Such couplings may facilitate the use of different power supplies etc. In FIG. 4B, both pairs of diagonally opposed bonding pads N1-P2 and P1-N2 are truncated, enabling a diagonal coupling of either pair of pads. In FIG. 4B, the truncated pads N1, P1, N2, P2 are doubly truncated, each having two non-orthogonal edges 330 and 330'. Although these additional truncations may not necessarily provide advantages for a die with two light emitting devices compared to the bond pads of FIG. 3A, they may provide advantages for dies having larger arrays of light emitting devices, as detailed further below.

FIGS. 5A-5D illustrate example alternative arrangements of truncated bond pads that facilitate alternative couplings of four light emitting devices using a single interconnect layer.

FIG. 5A is an example die 530 having a 2×2 array of light emitting devices 510A, 510B, 510C, 510D using the bond pad arrangement as illustrated in FIG. 3A; FIG. 5B is an example die 531 that uses the bond pad arrangement of FIG. 4A; and FIG. 5C is an example die 532 that uses the bond pad arrangement of FIG. 4B.

In FIG. 5A, the diagonally opposed truncated bond pads P1-N3 and P2-N4 facilitate a direct diagonal coupling of the complementary pair of diagonally opposite bond pads N1-P3 and N2-P4, respectively, when the die is situated on a substrate.

In FIGS. 5B and 5C, the diagonally opposed bond pads N1-P3, P1-N3, N2-P4, and P2-N4 facilitate a direct diagonal coupling of the complementary pair of diagonally opposite bond pads P1-N3, N1-P3, P2-N4, and N2-P4, respectively, when the die is situated on a substrate.

FIG. 5D illustrates a die 533 having a linear arrangement of four light emitting devices 515A, 515B, 515C, 515D with diagonally opposed truncated bond pads N1-P2, N2-P3, and N3-P4 that enable direct diagonal coupling of bond pads P1-N2, P2-N3, P3-N4, respectively, when the die is situated on a substrate.

FIGS. 6A-6C illustrate example single-layer interconnect patterns for coupling the example die 531 having four light emitting devices for operation at different nominal voltages, using the bond pad configuration of FIG. 5B. For ease of reference, and to avoid unnecessary clutter in these figures, the underlying light emitting devices having bond pads N1-P1, N2-P2, N3-P3, N4-P4 will be referred to as D1, D2, D3, and D4, respectively.

In FIG. 6A, conductive segment 660 couples all of the N bond pads N1, N2, N3, N4 of the die 531 to the negative node of the source 650, and segment 670 couples all of the P bond pads P1, P2, P3, P4 to the positive node of the source 650, placing all of the light emitting devices in parallel. Assuming that each light emitting device has a nominal operating voltage of 3 volts, this parallel combination has a nominal operating voltage of 3 volts. When this die 531 is mounted on a substrate containing conductive segments 660, 670, current travels from the 3 volt source 650 to nodes P1, P2, P3, P4 via segment 670. Current from nodes P1, P2, P3, P4 through D1, D2, D3, D4 in parallel to nodes N1, N2, N3, N4, which are coupled to the power source 650 via segment 660.

In FIG. 6B, conductive segments 621, 622, 661, 671 connect the devices of the die 531 in a series-parallel arrangement. When this die 531 is mounted on a substrate containing these conductive segments, segment 671 couples bond pads P2 and P4 to the positive node of source 651. Current travels in parallel through the corresponding devices, D2 and D4, to bond pads N2 and N4. Segment 621 couples bond pads P1 and N2; segment 622 couples bond pads P3 and N4. Current travels in parallel through D1 and D3 to bond pads N1 and N3, which are coupled to the negative node of source 651 via interconnect segment 661. The resulting series-parallel circuit will have a nominal operating voltage of 6 volts, assuming that each light emitting device has a nominal operating voltage of 3 volts. One of skill in the art will recognize that other series-parallel arrangements may be formed. For example, segments 621 and 622 may be coupled together, forming a single connection of bond pads P1, P3, N2, and N4.

In FIG. 6C, segments 623, 624, 625, 662, 672 connect the devices of the die 531 in a series-parallel arrangement. When this die 531 is mounted on a substrate containing these conductive segments, segment 672 couples bond pad P4 to the positive node of the source 652. Current flows from P4 through D4 to bond pad N4, which is coupled to bond pad P2 via a diagonal conductive segment 625. Current flows from P2 through D2 to bond pad N2, which is coupled to bond pad P1 via conductive segment 624. Current flows from P1 through D1 to bond pad N1, which is coupled to bond pad P3 via diagonal conductive segment 623. Current flows from P3 through D3 to bond pad N3, which is coupled to the negative node of source 652 via conductive segment 662. The resulting series circuit will have a nominal operating voltage of 12 volts, assuming that each light emitting device has a nominal operating voltage of 3 volts.

FIG. 8 illustrates the example die 531 situated on a substrate 820 having the conductive pattern of FIG. 6C. When the die is coupled to the substrate's conductive segments 662, 622, 623, 624, 672, typically via solder, the four devices on the die 531 will be coupled in series in the order of: D4, D2, D3, D1.

It is significant to note that the same die 531 is used in each of FIGS. 6A, 6B, 6C, and that the conductive segments forming the different circuit configurations of the devices on this die 531 may be formed using a single interconnect layer on a substrate.

FIGS. 7A-7C illustrate other example single-layer interconnect patterns for coupling a linear arrangement of four light emitting devices for operation at different nominal voltages, using the example die 533 having the arrangement of bond pads illustrated in FIG. 5D.

FIG. 7A illustrates all of the N bond pads N1, N2, N3, N4 coupled together by segment 760, and all of the P bond pads P1, P2, P3, P4 coupled together by segment 770, providing a parallel arrangement of all devices with a nominal operating voltage of 3 volts. When the die 533 is mounted on a substrate having the conductive segments 760, 770, current travels from the 3 volt power source 750 to nodes P1, P2, P3, P4 via segment 770. Current from nodes P1, P2, P3, P4 through D1, D2, D3, D4 in parallel to nodes N1, N2, N3, N4, which are connected to the power source 750 via segment 760.

FIG. 7B illustrates nodes N1 and N2 coupled together, nodes P1, P2, N3, N4 coupled together, and nodes P3, P4 coupled together, forming a series-parallel arrangement with a nominal operating voltage of 6 volts. When the die 533 is mounted on a substrate having the conductive segments 721, 761, 771, current travels from the power source 750 to nodes P3, P4 via segment 771. Current travels from nodes P3, P4 through D3, D4 in parallel to nodes N3, N4. Current travels from nodes N3, N4 to segments P1, P2 via conductive segment 721. Current travels from nodes P1, P2 through D1, D2 in parallel to nodes N1, N2, which are connected to the power source 751 via segment 761. FIG. 7C illustrates nodes P1-N2 coupled together, nodes P2-N3 coupled together, and nodes P3-N4 coupled together, forming a series arrangement with a nominal operating voltage of 12 volts. When the die 533 is mounted on a substrate having the conductive segments 722, 723, 724, 762, 772, current travels from the power source 752 to node P4 via segment 772. Current travels from node P4 through D4 to node N4, then from N4 to P3 via conductive segment 724. Current travels from node P3 through D3 to node N3, then from N3 to P2 via conductive segment 723. Current travels from node P2 through D2 to node N2, then from N2 to P1 via conductive segment 722. Current travels from node P1 through D1 to node N1, which is connected to the power source 752 via conductive segment 762.

Again, it is significant to note that the same die 533 is used in each of FIGS. 7A, 7B, 7C, and that the conductive segments forming the different circuit configurations of the Ds on this die 533 may be formed using a single interconnect layer on a substrate.

As illustrated in the examples herein, providing diagonally opposite truncated bond pads on a multi-device die enables a direct diagonal coupling of a complementary pair of diagonally opposite bond pads, thereby enabling the use of different connection patterns on a single layer substrate to provide arrangements of the light emitting devices on the die with different nominal operating voltages.

While the invention has been illustrated and described in detail in the drawings and foregoing description, such illustration and description are to be considered illustrative or exemplary and not restrictive; the invention is not limited to the disclosed embodiments.

For example, although only a 1×2, 2×2, and 1×4 array of light emitting devices is disclosed, one of ordinary skill in the art that the principles of this invention may be applied to any arrangement of multiple light emitting devices on a die. In like manner, one of skill in the art will recognize that it is possible to operate the invention in an embodiment wherein truncated bond pads with additional opposing non-orthogonal edges are provided. Extending the configuration illustrated in FIG. 5C, for example, each of the truncated bond pads may be truncated at each of the four corners, forming, for example, an elongated octagon, to provide further interconnect options. That is, in FIG. 5C, only lateral connections may be made among bond pads P2, N2, P3, N4, whereas octagon shaped bond pads would enable diagonal connections P1-N4 and P3-N2, as well as to bond pads of additional adjacent light emitting devices (not illustrated).

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting diode (LED) device comprising:
   an LED die comprising a plurality of light emitting elements, each of the plurality of light emitting elements including a pair of bond pads coupled thereto, each of the bond pads having a rectangular shape with four orthogonal edges, and at least one of the bond pads in each pair having at least one truncated corner, each of the truncated corners forming an additional, non-orthogonal edge,
   the plurality of light emitting elements being arranged within the die such that at least two diagonally opposite bond pads are truncated and have non-orthogonal edges that face one another.

2. The device of claim 1, further comprising a substrate on which the die is mounted, the substrate comprising a single interconnect layer, the plurality of light emitting elements comprising four light emitting elements, and the bond pads being arranged to enable a selection of a nominal operating voltage of three, six, or twelve volts using the single interconnect layer on the substrate.

3. The device of claim 2, wherein the four light emitting elements are arranged in a 2×2 array.

4. The device of claim 2, wherein the four light emitting elements are arranged in a 1×4 array.

5. The device of claim 1, wherein each of the truncated bond pads has five edges including the four orthogonal edges and one non-orthogonal edge.

6. The device of claim 1, wherein at least one of the truncated bond pads has six edges including the four orthogonal edges and two non-orthogonal edges.

7. The device of claim 1, further comprising a substrate on which the die is mounted, the substrate comprising a single interconnect layer, and the bond pads being arranged to enable an external coupling to a series connection of all of the plurality of light emitting elements using the single interconnect layer.

8. The device of claim 1, further comprising a substrate on which the die is mounted, the substrate comprising a single interconnect layer, and the bond pads being arranged to enable an external coupling to a parallel connection of all of the plurality of light emitting elements using the single interconnect layer on the substrate.

9. The device of claim 8, wherein the bond pads are arranged to enable an external coupling to a series-parallel connection of all of the plurality of light emitting elements using the single interconnect layer on the substrate.

10. The device of claim 8, wherein the die includes more than two pairs of bond pads, each bond pad in each pair has at least one truncated corner with corresponding non-orthogonal edges, and each of the plurality of light emitting elements is arranged such that each bond pad has at least one non-orthogonal edge that faces a non-orthogonal edge of a diagonally opposite bond pad.

11. The device of claim 10, wherein at least one bond pad is arranged within the die such that at least one non-orthogonal edge of the at least one bond pad faces two non-orthogonal edges of two separate bond pads.

12. The device of claim 10, wherein each pair of bond pads includes a p-type bond pad coupled to a p-layer of the corresponding light emitting element and an n-type bond pad coupled to an n-layer of the corresponding light emitting element.

13. The device of claim 12, further comprising a substrate on which the plurality of LED devices are arranged, the substrate comprising:
   a first conductive segment electrically coupled between all of the p-type bond pads for external connection to a negative node of a voltage source; and
   a second conductive segment electrically coupled between all of the n-type bond pads for external connection to a positive node of the voltage source.

14. The device of claim 12, further comprising a substrate on which the plurality of LED devices are arranged, the substrate comprising:
- a first conductive segment configured for electrical coupling of at least one n-type bond pad to a negative node of a voltage source;
- a second conductive segment configured for electrical coupling of at least one p-type bond pad to a positive node of the voltage source; and
- at least one third conductive segment directly coupled between a respective n-type bond pad of a light emitting element to a respective p-type bond pad of a separate light emitting element.

15. The device of claim 12, further comprising a substrate on which the plurality of LED devices are arranged, the substrate comprising:
- at least one first conductive segment configured for electrical coupling of at least one p-type bond pad to a positive node of a voltage source;
- at least one second conductive segment configured for electrical coupling of at least one n-type bond pad to a negative node of the voltage source; and
- a third conductive segment electrically coupled between all other p-type and n-type bond pads.

16. The device of claim 1, wherein the bond pads are situated with a separation distance that accommodates manufacturing tolerances with respect to interconnect patterns on a substrate on which the plurality of light emitting elements are to be mounted.

\* \* \* \* \*